United States Patent
Lai et al.

(10) Patent No.: US 8,466,505 B2
(45) Date of Patent: Jun. 18, 2013

(54) MULTI-LEVEL FLASH MEMORY CELL CAPABLE OF FAST PROGRAMMING

(75) Inventors: Li-Shyue Lai, Jhube (TW); Hung-Wei Chen, Hsin-Chu (TW); Wen-Chin Lee, Hsin-Chu (TW); Min-Hwa Chi, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1324 days.

(21) Appl. No.: 11/077,479

(22) Filed: Mar. 10, 2005

(65) Prior Publication Data
US 2006/0202254 A1 Sep. 14, 2006

(51) Int. Cl.
*H01L 29/788* (2006.01)

(52) U.S. Cl.
USPC .......................................... 257/315

(58) Field of Classification Search
USPC .......................................... 257/315
See application file for complete search history.

(56) References Cited

U.S. PATENT DOCUMENTS

| | | | |
|---|---|---|---|
| 4,794,565 A * | 12/1988 | Wu et al. | 365/185.15 |
| 4,852,062 A * | 7/1989 | Baker et al. | 365/185.15 |
| 5,177,568 A | 1/1993 | Honma et al. | |
| 5,793,088 A | 8/1998 | Choi et al. | |
| 6,040,610 A | 3/2000 | Noguchi et al. | |
| 6,060,743 A * | 5/2000 | Sugiyama et al. | 257/321 |
| 6,096,605 A * | 8/2000 | Hong | 438/266 |
| 6,143,607 A * | 11/2000 | Chi | 438/257 |
| 6,967,363 B1 * | 11/2005 | Buller | 257/288 |
| 7,821,057 B2 * | 10/2010 | Ishihara | 257/321 |
| 2006/0113612 A1 * | 6/2006 | Gopalakrishnan et al. | 257/392 |

OTHER PUBLICATIONS

Iizuka, H., et al., "Electrically Alterable Avalanche-Injection-Type MOS Read-Only Memory with Stacked-Gate Structure," IEEE Transactions on Electron Devices, vol. ED-23, No. 4, Apr. 1976, pp. 379-387.
Gopalakrishnan, K., et al., "I-MOS: A Novel Semiconductor Device with a Subthreshold Slope Lower than kT/q," IEDM, 2002, pp. 289-292.
Ha, Y.H., et al., "An Edge Contact Type Cell for Phase Change RAM Featuring Very Low Power Consumption," 2003 Symposium on VLSI Technology Digest of Technical Papers, Jun. 2003, 2 pages.

* cited by examiner

*Primary Examiner* — Howard Weiss
(74) *Attorney, Agent, or Firm* — Slater & Matsil, L.L.P.

(57) ABSTRACT

A semiconductor device and a method of forming the same. The semiconductor device comprises a gate structure comprising a tunnel oxide over a substrate; a floating gate over the tunnel oxide; a dielectric over the floating gate; and a control gate over the dielectric. The semiconductor device further comprises: spacers along opposite edges of the gate structure; a first impurity region doped with a first type of dopant laterally spaced apart from a first edge of the gate structure; and a second impurity region doped with a second type of dopant, opposite from the first type, the drain being substantially under the drain spacer and substantially aligned with a second edge of the gate structure.

12 Claims, 6 Drawing Sheets

MULTI-LEVEL FLASH MEMORY CELL CAPABLE OF FAST PROGRAMMING

CROSS-REFERENCE TO RELATED APPLICATIONS

This application relates to co-pending and commonly assigned patent application Ser. No. 11/077,478, filed concurrently herewith, entitled "Self-Aligned Gated p-i-n Diode for Ultra-Fast Switching."

TECHNICAL FIELD

This invention relates generally to semiconductor devices, and more specifically to flash memory based on i-MOS transistor structures and methods of forming the same.

BACKGROUND

Flash memory has become increasingly popular in recent years. A typical flash memory comprises a memory array having a large number of memory cells arranged in blocks. Each of the memory cells is fabricated as a field-effect transistor having a control gate and a floating gate. The floating gate is capable of holding a charge and is separated from source and drain regions contained in a substrate by a layer of thin oxide. Each of the memory cells can be electrically charged by injecting electrons from the drain region through the oxide layer onto the floating gate. The charge can be removed from the floating gate by tunneling the electrons to the substrate through the oxide layer during an erase operation. Thus the data in a memory cell is determined by the presence or absence of a charge on the floating gate.

FIG. 1 illustrates a typical floating-gate flash memory cell 1. The memory cell 1 comprises a floating gate 4 that is isolated between a tunnel oxide 2 and an interpoly dielectric 6, and a control gate 8. The floating-gate 4 is typically doped polysilicon. The tunnel oxide 2 typically has a thickness of from 80 Å to 100 Å so that erasing can be performed through channel by Fowler-Nordheim (FN) tunneling while good charge retention is still maintained. The coupling ratio between the floating gate 4 and the control gate 8 needs to be great enough, for example, at about 0.8. Sufficient coupling area is needed between the floating gate 4 and the control gate 8. Oxide-nitride-oxide (ONO) dielectric with a thickness of between about 150 Å and about 300 Å is typically used as the interpoly dielectric 6 between the floating gate 4 and control gate 8 since it combines the high k value of the silicon nitride and good characteristics of the silicon dioxide.

The flash memory cell 1 is typically programmed by channel hot electrons, which are generated by channel current and injected into the floating gate 4. With drain 12 and control gate 8 biased at around 5V to 8V, the programming time is typically in micro-second range. The flash memory cell 1 has a threshold voltage $V_t$ that increases with the charge stored at the floating gate 4. The electrons stored in the floating gate also affect the channel current. Therefore, the magnitude of $V_t$ or channel current can be used to determine values stored in the memory cell. Stored electrons are typically removed by FN tunneling through the channel to the substrate with a high negative voltage, for example, −10V, applied to the control gate 8.

Hot electrons can also be generated from avalanche breakdown at the drain junction and thus cause impact ionization. However, in conventional memories employing an avalanche breakdown mechanism, the breakdown region is well below the channel surface. The injection efficiency is typically lower than about 0.01%. Furthermore, if a laterally diffused drain is used in a memory cell, the drain junction breakdown can only occur at a much higher bias. Thus, there is a need for improving injection efficiency and lowering bias voltages. It is also highly preferred that operation voltages are not higher than the core operation voltage of the integrated circuit.

An i-MOS device, where "i" stands for intrinsic, is also known in the art. A typical i-MOS device is illustrated in FIG. 2. The i-MOS device has a heavily doped p-type region 30 and an n-type region 32 separated by an intrinsic region 33. A gate 38 is above the intrinsic region 33 to control the channel. The i-MOS device has an offset channel region 34 between the source 30 and gate-edge 35. When the channel 36 underneath the gate is inverted by the gate bias, the drain-source voltage drops mainly across the offset region 34 and triggers avalanche breakdown.

SUMMARY OF THE INVENTION

The preferred embodiment of the present invention presents a floating gate flash memory structure and a method of forming the same.

In accordance with one aspect of the present invention, a gate structure, which comprises a tunnel oxide, a floating gate, an interpoly dielectric and a control gate, is formed on a substrate comprising a bulk silicon that is intrinsic, either lightly doped or un-doped. A drain implant is performed to form a drain. A pair of spacers is formed. A source implant is performed to form a source. The source implant introduces a source impurity having a type opposite to the drain impurity type. A source silicide and a drain silicide are then formed on the source and the drain, respectively. A narrow space is left between the source and respective edge of the gate structure.

In accordance with another aspect of the present invention, the floating gate flash memory cell can be formed on a buried oxide. Silicon or germanium containing materials such as Si, SiGe, or Ge can be used in the source, the drain, and the channel area.

The space between the source and its corresponding edge of the gate structure forms an offset region. When the depletion region under the gate structure is inverted, the drain-source voltage is mainly applied to the narrow offset region. This causes a high electrical field and in turn avalanche breakdown in the offset region. Electrons are injected into the floating gate near the source side. By using the avalanche breakdown mechanism, the operation voltages of the floating gate flash memory is greatly reduced and injection efficiency improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A manufacturing process of a preferred embodiment of the present invention is discussed. Variations of the preferred embodiments are presented, wherein like reference numbers are used to designate like elements throughout the various views and illustrative embodiments of the present invention. Each figure number may be followed by a letter A, B, or C showing variations of the same process step.

FIGS. 3 through 6 illustrate cross-sectional views of intermediate stages in the manufacture of a flash cell memory cell. FIG. 3A illustrates shallow trench isolations (STI) 53 formed in a substrate 50. The STIs 53 are preferably formed by etching shallow trenches in substrate 50, and filling the trenches with an insulator such as silicon oxide. In one embodiment, substrate 50 is formed of a bulk material such as Si. In alternative embodiments, substrate 50 has a structure of silicon-on-insulator (SOI), as illustrated in FIG. 3B. Preferably, the insulator, or buried oxide (BOX) 44, has a thickness of between about 10 nm and about 200 nm, and the silicon layer 46 on the buried oxide has a thickness of about 2 nm to about 200 nm. In a more preferred embodiment, bulk SiGe, bulk germanium (Ge), SiGe on insulator (SGOI), Ge on insulator (GOI), or strained-Si on insulator (SSOI) is used as the substrate 50 in FIG. 3A or silicon layer 46 in FIG. 3B. SiGe has several advantageous features. Since SiGe has a smaller band gap and therefore a lower avalanche breakdown field than Si, it is particularly suitable for the i-MOS devices employing the avalanche mechanism. With a lower avalanche breakdown field, device reliability is improved since hot carrier's energy is lowered. Also, devices with SiGe in the source and drain regions can induce compressive stress on the device channel and further enhance the avalanche mechanism. The substrate 50 in FIG. 3A and silicon layer 46 in FIG. 3B are preferably intrinsic. If doped, the impurity concentration is preferably lower than about $1E17/cm^3$.

Figure 1:
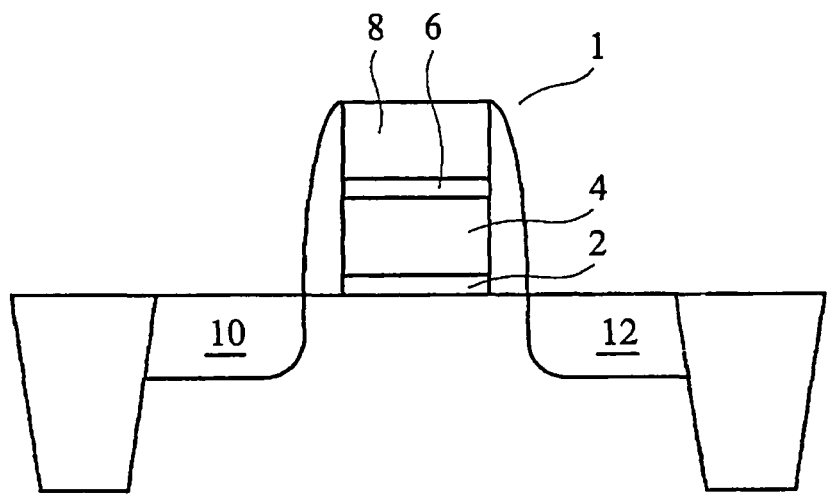
FIG. 1 illustrates a conventional floating gate flash memory cell.
Figure 2:
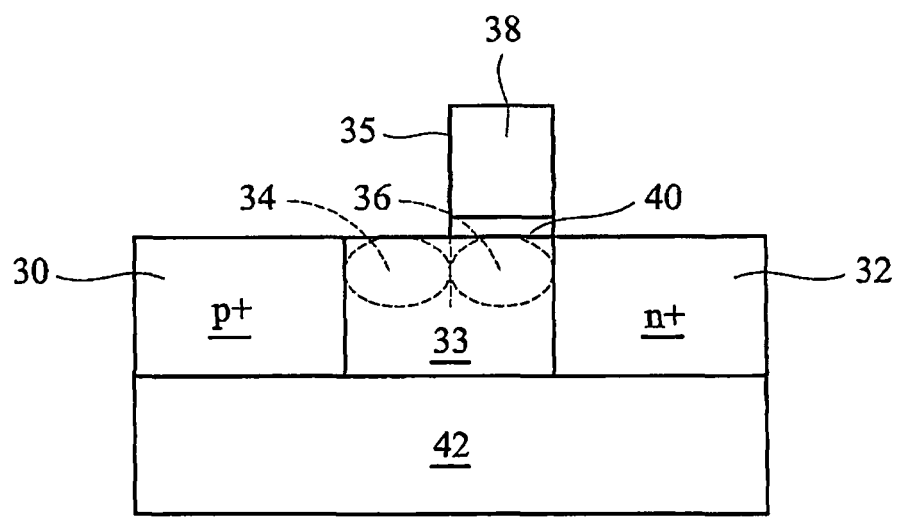
FIG. 2 illustrates a conventional i-MOS device.
Figure 3A:
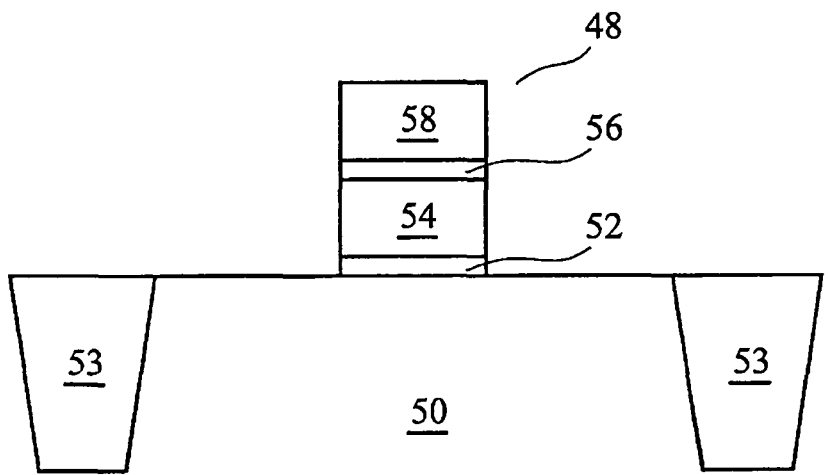
FIGS. 3 through 6 are cross-sectional views of intermediate stages in the manufacture of a preferred embodiment of the present invention.
Figure 3B:
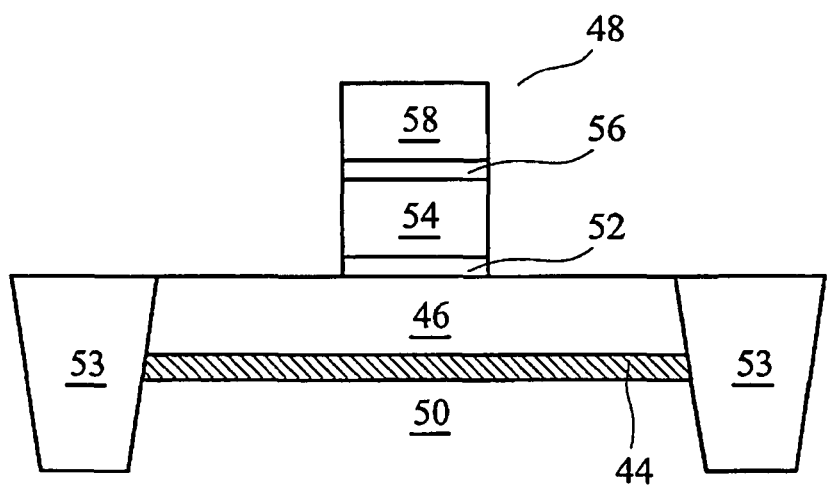
Figure 3C:
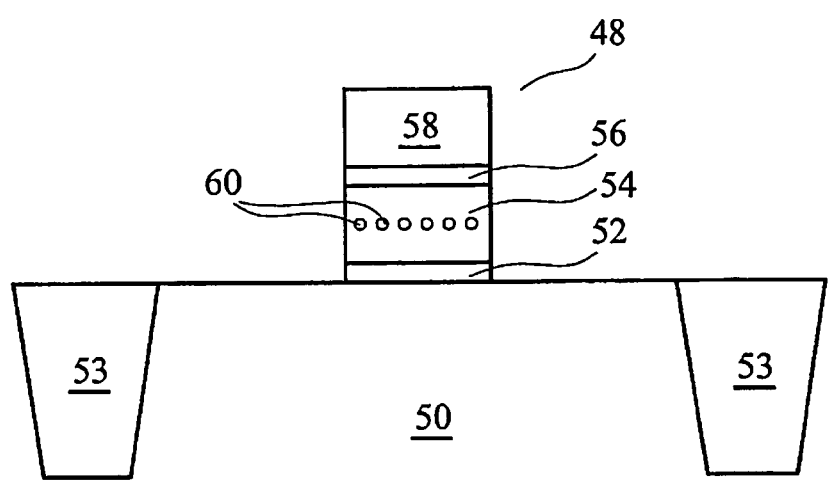

FIG. 3A also illustrates the formation of a gate structure 48. A tunneling oxide 52 is first formed on substrate 50 with a preferred thickness of from about 10 Å to about 200 Å, more preferably about 80 Å. The tunneling oxide 52 is preferably an oxide such as silicon oxide formed by thermal oxidation. A floating gate layer 54 is then formed. In the preferred embodiment, the floating gate is a continuous conducting layer formed of conductive materials such as lightly doped polysilicon. Based on the thickness of the tunneling oxide, it can be referred either as a thick oxide, where the thickness is greater than about 3 nm, or a thin oxide, where the thickness is less than about 3 nm. Thick tunneling oxide 52 has lower leakage and thus longer retention time. However, it is harder for the injection of electrons. In alternative embodiments, the floating gate 54 can be a layer of distributed islands formed of materials such as polysilicon, germanium, and silicon nitride or other nano-crystal (such as Si, Ge, high-k nano-dots). In yet other embodiments, the floating gate 54 has semiconductor nano-islands 60, as shown in FIG. 3C. The nano-islands 60 preferably are silicon dots.

A dielectric layer 56, often referred as interpoly dielectric 56, is then formed on the floating gate layer 54. The interpoly dielectric layer 56 preferably has a dielectric constant (k value) of higher than about 3.9. In the preferred embodiment, the interpoly dielectric 56 has a sandwiched oxide-nitride-oxide (ONO) structure. In alternative embodiments, the interpoly 56 can be oxide or other higher k materials such as $HfSiO_x$ and $Ta_2O_5$. The thickness of the interpoly dielectric 56 is preferably between about 20 Å and about 200 Å.

A control gate layer 58 is then formed on the interpoly dielectric layer 56. The control gate 58 can be polysilicon or other commonly used materials. The stacked layers are then masked and patterned, forming a gate structure 48.

The gate structure 48 may also have different combinations of materials. Possible combinations include metal-oxide-nitride-oxide-silicon (MONOS), silicon-oxide-nitride-silicon (SONOS), silicon-nitride-oxide-silicon (SNOS), and metal-nitride-oxide-silicon (MNOS). Also, the well-known triple gate and split gate structures can also be used.

Figure 4:
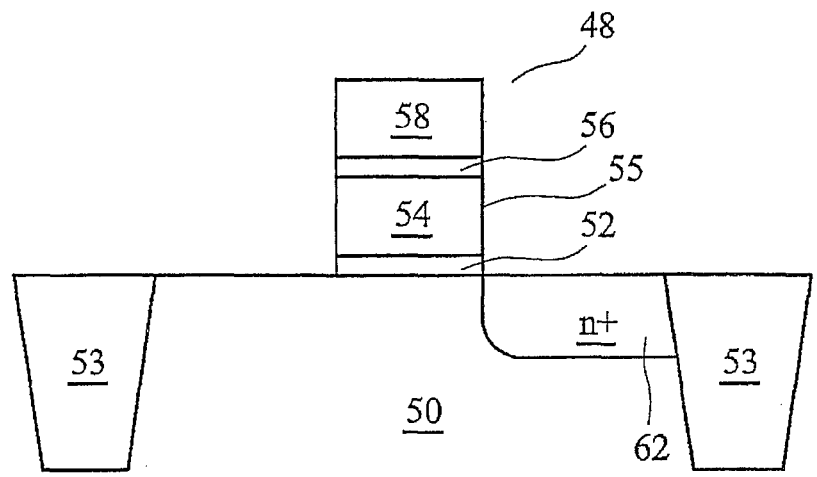

The structure formed in the previous processes is then subject to an n+ tilted angle implanting to form a drain region 62, the tilted angle is between about 0° to about 45°. The structure is illustrated in FIG. 4. A mask layer (not shown) is formed source region and optionally on the gate structure 48 to protect them from being implanted. The gate structure 48 serves as a self-aligning mask so that formed drain n+ region is substantially aligned with the boundary 55 of the gate structure 48. The n+ implant preferably has a dosage of from about $1\times10^{15}/cm^2$ to about $1\times10^{16}/cm^2$. The mask layer is then removed.

Figure 5:
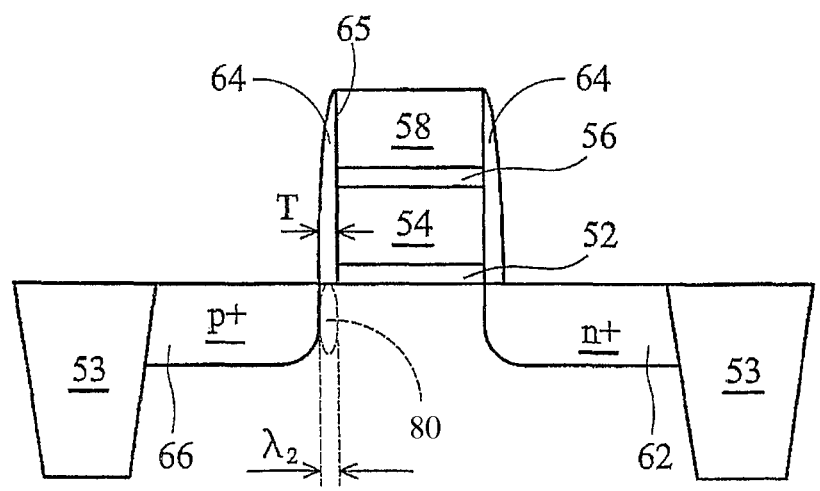

FIG. 5 illustrates the formation of spacers 64 and source region 66. Spacers 64 may be formed by well-known methods such as blanket depositing a dielectric layer over the entire region, then anisotropically etching to remove the dielectric from the horizontal surfaces and leaving spacers 66. Spacers 66 preferably have a sidewall thickness T of between about 1 nm and about 100 nm, more preferably about 50 nm. The sidewall thickness T is an important factor, since the magnitude of the electrical field and avalanche breakdown are affected by it.

FIG. 5 also illustrates the formation of the source region 66 by a p+ tilted angle implanting, the tilted angle is between about 0° to about 45°. A mask layer (not shown) is formed to cover the drain 62 and, optionally, the gate structure 48. The spacers 64 are used as a mask so that an edge of the p+ region 66 is aligned with the spacer 66 on the source side. The implant dosage is preferably between about $1\times10^{15}/cm^2$ and $1\times10^{16}/cm^2$. Deeper p+ regions are preferred since the resulting device will have reduced leakage through the bulk region 50 due to a Schottky barrier formed in the subsequent steps. The mask layer is then removed.

Due to the masking of the source side spacer 64, the p+ region 66 is spaced apart from the boundary 65 of the gate structure 48 and, thus, an offset region 80 is formed. The offset region 80 is the region where avalanche breakdown occurs, since most of the drain-source voltage is applied to the offset region 80 when the channel under the gate structure 48 is inverted. Due to the self-alignment of the spacers 66, the width $\lambda_2$ of the offset region 80 is substantially close to the width T of the spacers 64.

Figure 6:
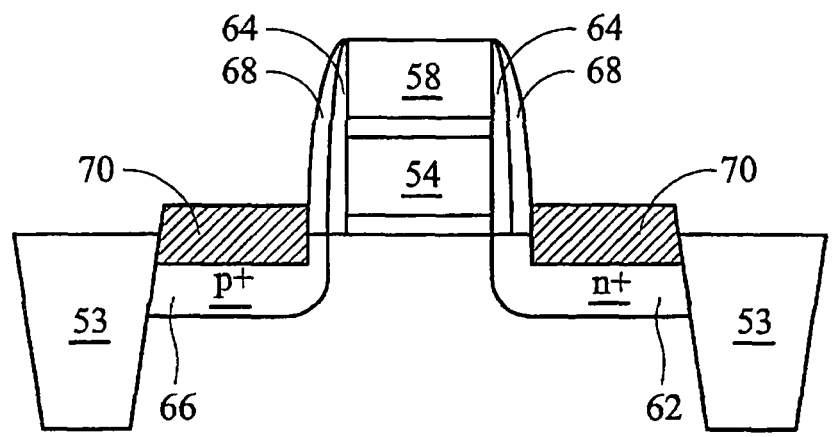

FIG. 6 illustrates the formation of suicides 70. To form a silicide layer, a metal layer is formed by depositing a thin layer of metal, such as cobalt, nickel, erbium, molybdenum, platinum, or the like, over the device. The device is then annealed to form a silicide between the deposited metal and the underlying exposed silicon regions. Excessive metal is then removed. On the source side, silicide 70 needs to be formed away from the outer edge of the spacer 64. Otherwise, the p+ region near the channel surface may be completely consumed. In the preferred embodiment, spacers 68 are formed along the spacers 64 and act as mask for the silicidation process. In other embodiments, a mask is formed so that the deposited metal layer is separated from the outer edge of the spacer 64 on the source side. Preferably, the silicides 70 are shallower than the source and drain regions 66 and 62. The remaining p+ region under the spacer 64 on the source side forms a source 66. The source 66 extends to the bottom of the silicide 70. On the drain side, the n+ region 62 is preferably deeper than silicide region 70, a Schottky barrier formed between the interface of metal silicide 70 and semiconductor 62 helps reduce leakage current. In the case that there is a buried oxide 44, as referred to in FIG. 3B, silicide 70 may completely consume the p+ and n+ regions under the silicide 70 without increasing leakage.

Figure 7:
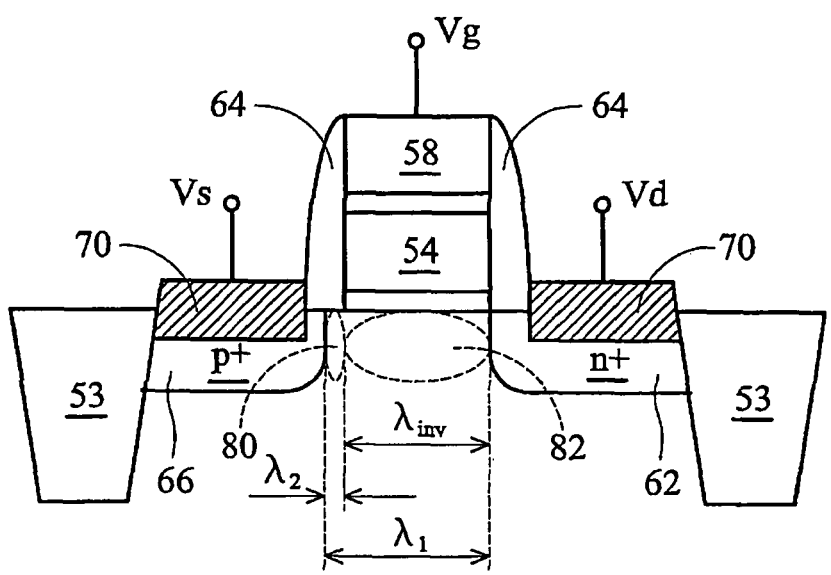
FIG. 7 illustrates the operations of the preferred embodiment of the present invention.

FIG. 7 illustrates inversion and offset regions of the embodiment formed in the previously discussed steps. When no bias is applied to the control gate 58, the depletion region, which includes the offset region 80 and region 82, has a length $\lambda_1$. When a bias that is higher than the threshold voltage is applied to the control gate 58, the region 82, which is the channel under the floating gate 54, is inverted and, therefore, the depletion region has a length $\lambda_2$, which equals $\lambda_1-\lambda_{inv}$, where $\lambda_{inv}$ is the length of the inversion region under the gate. Since most of the drain voltage is applied to the narrow offset region 80, the electrical field in the depletion region is much higher and surface avalanche breakdown occurs.

The preferred embodiment of the present invention requires lower bias voltage than conventional floating gate flash memories. Programming is performed by biasing the gate voltage $V_g$ to a positive voltage. In an exemplary programming setting, gate voltage $V_g$ is biased to 1V, source voltage is set to 0V, and the drain voltage is set to 0.8V. Even under the low bias voltages applied, there is a high electrical field in the offset region 80, leading to impact ionization near surface. For example, if there is 0.8V across the offset region 80 with a thickness $\lambda_2$ of 100 Å, the electrical field is about 0.8 MV/cm, which is already higher than the typical breakdown voltage in silicon having doping concentration of 5E17 cm$^{-3}$ or higher. Under such a high electric field, surface avalanche occurs and the impact ionization is triggered near the channel surface. Hot electrons generated from the surface impact ionization are injected into the floating gate 54. The injected electrons can be locally trapped near the source side if the floating gate is formed of distributed islands that are not conductive to each other. If the floating gate 54 is a polysilicon, a mid-gate silicide or other conducting materials with continuous layer, then trapped electrons are distributed over entire floating gate 54.

The preferred embodiment of the present invention is self-limiting in the sense that with more electrons injected in the floating gate, the effect of the control gate bias is gradually offset, the inversion layer eventually disappears and the injection mechanism stops. More electrons are injected into the floating gate with higher control gate voltage. By adjusting the control gate bias $V_g$, multiple levels of electrons can be programmed onto the floating gate 54.

Figure 8:
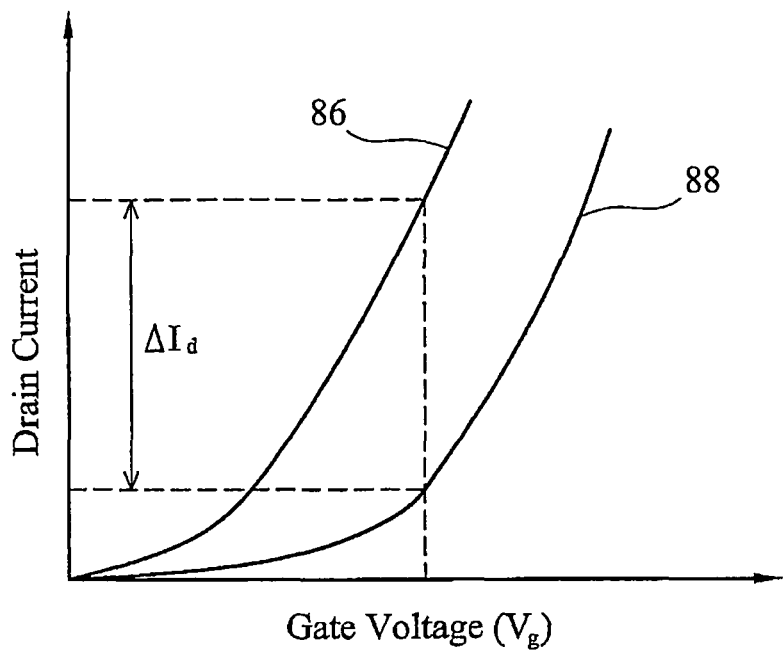
FIG. 8 illustrates a drain current as a function of the gate voltages, wherein the current difference between a programmed memory cell and an un-programmed memory cell is in an order of milliamps.

Read operation is performed by measuring the drain-source current, typically with the control gate 58 grounded and small negative drain voltage $V_d$ applied. The forward-bias current, which flows from the source 66 through the channel region into the drain region 62, is modulated by the amount of electrons trapped in the floating gate 54. The electrons in the floating gate 54 tend to attract holes and accumulate holes in the channel surface. If no electron is presented on the surface of the channel, the built-in field tends to deplete holes on the surface of the channel. Thus, the stored electrons in the floating body will result in smaller drain current $I_d$ during read operation. In an exemplary read operation, gate voltage $V_g$ and source voltage $V_s$ can be at about 0V and the drain voltage can be set to −0.5V. FIG. 8 illustrates drain currents as a function of the gate voltages. Line 86 shows the result with electrons stored in floating gate, and line 88 shows the result without electrons stored in floating gate. With the same control voltage applied, the drain current of line 86 is higher than that of the line 88. Therefore, the amplitudes of the drain current $I_d$ may be used to represent the stored "1" or "0." A higher drain current difference $\Delta I_d$ is preferred. In the preferred embodiment, the drain current difference $\Delta I_d$ is in an order of milliamps, great enough for no error reads.

Besides storing typical information such as "1" and "0," the preferred embodiments of the present invention can store different levels of electrons in the floating gate, thereby storing more states. If one level of electrons represents one state, multiple levels of electrons in the floating gate can represent multiple states. By applying certain control voltage and measuring the drain-source current, the level of the electrons stored can be found and the corresponding state identified.

Figure 9:
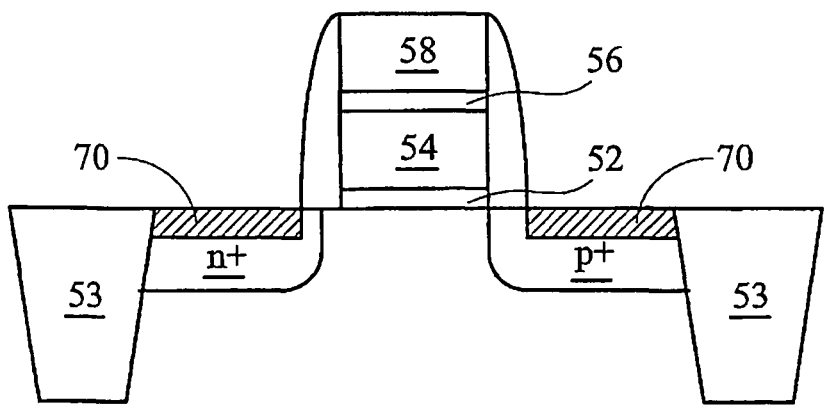
FIG. 9 illustrates another embodiment of the present invention, wherein the drain and source impurity types are reversed from the previously described embodiment.

FIG. 9 illustrates another embodiment of the present invention. This embodiment is similar to the embodiment formed in the previously discussed processes, except that the impurity type of the source and drain regions are reversed. The operations are also similar to the previous embodiment.

By utilizing the surface avalanche breakdown mechanism, the preferred embodiments of the present invention are capable of fast programming, typically in nano-seconds range. The fabrication methods of the preferred embodiments of the present invention are fully compatible with convention CMOS processes. Multiple levels of programming can be achieved and multiple states can be represented by the preferred embodiments.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor device comprising:
  a substrate;
  a gate structure comprising:
    a tunnel oxide over the substrate;
    a floating gate over the tunnel oxide;
    a dielectric over the floating gate; and
    a control gate over the dielectric;

a source region doped with a dopant of a first type adjacent to the gate structure;

a drain region doped with a dopant of a second type opposite the first type adjacent to the gate structure;

a first source spacer and a first drain spacer having substantially an equal width on opposite sides of the gate structure, wherein the first source spacer comprises an inner edge contacting a first edge of the gate structure, and an outer edge substantially aligned to an inner edge of the source region; and wherein the source, the drain and the substrate directly under the first source spacer are doped at a concentration sufficient to result in surface avalanche at a channel surface in the substrate when a voltage around 0.8 volts is applied across the source and drain, and wherein an inner edge of the drain region is substantially aligned to a second edge of the gate structure.

2. The semiconductor device of claim 1 wherein the substrate has an impurity concentration of less than about $1\times10^{17}/cm^3$.

3. The semiconductor device of claim 1 wherein the substrate has a structure of silicon-on-insulator (SOI).

4. The semiconductor device of claim 1 wherein the floating gate comprises isolated islands.

5. The semiconductor device of claim 4 wherein the isolated islands are nano-islands.

6. The semiconductor device of claim 1 comprising a flash memory cell, wherein the flash memory cell comprises the gate structure, the source region, and the drain region, and wherein the flash memory cell is configured to be programmed through an avalanche breakdown.

7. The semiconductor device of claim 1, wherein the source region is a p-type region, and the drain region is an n-type region.

8. The semiconductor device of claim 1, wherein the source region is an n-type region, and the drain region is a p-type region.

9. The semiconductor device of claim 1 further comprising:
   a second source spacer comprising an inner edge contacting the outer edge of the first source spacer;
   a source silicide over the source region, wherein an inner edge of the source silicide is substantially aligned to an outer edge of the second source spacer;
   a second drain spacer comprising an inner edge contacting the outer edge of the first drain spacer; and
   a drain silicide over the drain region, wherein an inner edge of the drain silicide is substantially aligned to an outer edge of the second drain spacer.

10. A semiconductor device comprising:
    a substrate;
    a gate structure comprising:
       a tunnel oxide over the substrate;
       a floating gate over the tunnel oxide;
       a dielectric over the floating gate; and
       a control gate over the dielectric;
    a source region laterally spaced apart from a first edge of the gate structure, with the first edge being closest to the source region among edges of the gate structure adjacent to the gate structure, and wherein the source region is of n-type;
    a drain region having an edge substantially aligned to a second edge of the gate structure, wherein the drain region is of p-type; and
    wherein the source, the drain, and the substrate directly under to source-side spacer that is on a sidewall of the gate structure are doped at a concentration sufficient to result in surface avalanche at a channel surface of the substrate when a voltage around 0.8 volts is applied across the source and drain and a voltage around 1.0 volts is applied across the gate and source.

11. The semiconductor device of claim 10 further comprising:
    a source spacer having an inner edge contacting the first edge of the gate structure, wherein an inner edge of the source region is overlapped by the source spacer;
    a source silicide region over the source region, wherein an inner edge of the source silicide region is substantially aligned to an outer edge of the source spacer;
    a drain spacer having an inner edge contacting the second edge of the gate structure; and
    a drain silicide region over the drain region, wherein an inner edge of the drain silicide region is substantially aligned to an outer edge of the drain spacer.

12. A semiconductor device comprising:
    a substrate;
    a gate structure comprising:
       a tunnel oxide over the substrate;
       a floating gate over the tunnel oxide;
       a dielectric over the floating gate; and
       a control gate over the dielectric;
    a source region laterally spaced apart from a first edge of the gate structure, with the first edge being closest to the source region among edges of the gate structure adjacent to the gate structure, and wherein the source region is of p-type;
    a drain region having an edge substantially aligned to a second edge of the gate structure, wherein the drain region is of n-type; and
    wherein the source, the drain and the substrate directly under a source-side spacer that is on a sidewall of the gate structure are doped at a concentration sufficient to result in surface avalanche at a channel surface of the substrate and hot carrier injection into the floating gate when a voltage around 0.8 volts is applied across the source and drain and a voltage around 1.0 volts is applied across the gate and source.

* * * * *